US009929195B2

(12) United States Patent
Lee et al.

(10) Patent No.: US 9,929,195 B2
(45) Date of Patent: Mar. 27, 2018

(54) IMAGE SENSOR ASSEMBLY, METHOD OF MANUFACTURING THE SAME, AND CAMERA MODULE

(71) Applicant: SAMSUNG ELECTRO-MECHANICS CO., LTD., Suwon-si (KR)

(72) Inventors: Kang Hyun Lee, Suwon-si (KR); Sung Min Song, Suwon-si (KR); Jung Gon Choi, Suwon-si (KR); Heung Woo Park, Suwon-si (KR); Jae Hyun Lim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/095,419

(22) Filed: Apr. 11, 2016

(65) Prior Publication Data

US 2017/0062503 A1  Mar. 2, 2017

(30) Foreign Application Priority Data

Aug. 27, 2015 (KR) .................. 10-2015-0121070

(51) Int. Cl.
*H01L 27/146* (2006.01)
(52) U.S. Cl.
CPC .. *H01L 27/14618* (2013.01); *H01L 27/14625* (2013.01); *H01L 27/14683* (2013.01)
(58) Field of Classification Search
CPC ......... H01L 27/14618; H01L 27/14625; H01L 27/14683; H01L 2924/00; H04N 5/2257

USPC .. 257/E31.058, E31.063, E31.115, E25.032, 257/E27.133–E27.139, 414, 431, 432, 257/433, 435; 216/26; 438/116, 64, 66
See application file for complete search history.

(56) References Cited

U.S. PATENT DOCUMENTS

| 2004/0159920 A1* | 8/2004 | Omori ..................... H01L 23/04 257/676 |
| 2005/0264677 A1* | 12/2005 | Uchida ............. H01L 27/14618 348/340 |
| 2007/0019101 A1* | 1/2007 | Minamio .......... H01L 27/14618 348/335 |
| 2007/0210246 A1* | 9/2007 | Ellenberger ...... H01L 27/14625 250/239 |
| 2008/0003926 A1 | 1/2008 | Watanabe et al. |
| 2009/0045476 A1* | 2/2009 | Peng ................. H01L 27/14618 257/432 |

(Continued)

FOREIGN PATENT DOCUMENTS

| KR | 2003-0069321 A | 8/2003 |
| KR | 10-2008-0091439 A | 10/2008 |

(Continued)

*Primary Examiner* — Joanathan Han
(74) *Attorney, Agent, or Firm* — NSIP Law

(57) ABSTRACT

An image sensor assembly, a method of manufacturing the same, and a camera module are provided. The image sensor assembly includes an image sensor including a pixel region provided on a surface of the image sensor, a cover disposed above the pixel region, a spacer disposed on a surface of the cover and the spacer being configured to maintain a distance between the image sensor and the cover, and an adhesive configured to fixedly attach the spacer to the image sensor, wherein the spacer comprises a first and a second member disposed parallel to and at a distance from each other.

13 Claims, 4 Drawing Sheets

A-A

(56) References Cited

U.S. PATENT DOCUMENTS

2009/0200630 A1    8/2009  Yamamoto
2013/0193545 A1*   8/2013  Jeong .................. H01L 31/0236
                                                          257/433

FOREIGN PATENT DOCUMENTS

KR    10-2008-0091867 A    10/2008
KR    10-2013-0076287 A     7/2013

* cited by examiner

IMAGE SENSOR ASSEMBLY, METHOD OF MANUFACTURING THE SAME, AND CAMERA MODULE

CROSS-REFERENCE TO RELATED APPLICATION

This application claims the priority and benefit under 35 USC § 119(a) of Korean Patent Application No. 10-2015-0121070, filed on Aug. 27, 2015 with the Korean Intellectual Property Office, the entire disclosure of which is incorporated herein by reference for all purposes.

BACKGROUND

1. Field

The following description relates to an image sensor assembly of a camera module used to photograph an image, a method of manufacturing the same, and a camera module.

2. Description of Related Art

An image sensor converts an optical signal including image information or distance (or depth) information on a subject into an electrical signal. An image sensor assembly generally includes the image sensor, a housing sealing the image sensor, and a filter (for example, an infrared filter) coupled to the housing and filtering a specific component of incident light introduced into the image sensor. The filter is generally coupled to the housing, which reduces an interval between the filter and the image sensor, and increases a thickness of the image sensor assembly.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided an image sensor assembly in which an interval between a filter and an image sensor may be reduced, a method of manufacturing the same, and a camera module.

In another general aspect, there is provided an image sensor assembly including an image sensor including a pixel region provided on a surface of the image sensor, a cover disposed above the pixel region, a spacer disposed on a surface of the cover and the spacer being configured to maintain a distance between the image sensor and the cover, and an adhesive configured to fixedly attach the spacer to the image sensor, wherein the spacer comprises a first and a second member disposed parallel to and at a distance from each other.

The adhesive may include a first adhesion part interposed between the spacer and the image sensor and a second adhesion part filled in a space between the first member and the second member.

The first member may be configured to enclose the effective pixel region and the second member encloses the first member.

The spacer may include an extension groove, the extension groove extending the distance between the first member and the second member within the extension groove.

The spacer may have a quadrilateral shape, and the extension groove is provided in a vertex of the quadrilateral spacer.

The image sensor may include electrodes disposed along a circumference of the pixel region, and the spacer may be disposed between the pixel region and the electrodes.

The first member may enclose an internal space containing the pixel region.

The second member may include a vent hole to discharge fluid from between the first member and the second member.

An area of the cover may be greater than an area of the pixel region and smaller than an area of a region formed by the electrodes.

The spacer may be disposed at a first distance from the pixel region and at a second distance from the electrode.

A shape of the spacer may correspond to a shape of the pixel region.

In another general aspect, there is provided a method of manufacturing an image sensor assembly, including forming spacers on a surface of a cover, applying an adhesive to the spacers, seating the spacers on an image sensor, and hardening the adhesive.

The applying of the adhesive may include injecting the adhesive into a space in the spacers.

The forming of the spacers may include forming a dry film photo-resist (DFR) on the surface of the cover, and partially removing the DFR by photolithography to form the spacers.

The spacers may include an inner spacer enclosing a pixel region in the image sensor and an outer spacer enclosing the inner spacer and spaced at a distance from the inner spacer.

The image sensor may include electrodes disposed along a circumference of a pixel region in the image sensor, and the spacers may be affixed between the pixel region and the electrodes.

The hardening of the adhesive may include heating the adhesive or irradiating ultraviolet (UV) light to the adhesive.

The applying of the adhesive may include injecting the adhesive in an extension groove that extends a distance between the spacers.

The extension groove may be formed by changing a shape of one of the spacers.

The adhesive may be injected into the extension groove and may be diffused between the spacers.

In another general aspect, there is provided a camera module including a substrate on which an image sensor assembly is mounted, a lens part including at least one lens, and a housing configured to accommodate the lens part and the image sensor assembly, wherein the image sensor assembly includes an image sensor including a pixel region provided on a surface of the image sensor, a cover disposed above the pixel region, a spacer disposed on a surface of the cover and the spacer being configured to maintain a distance between the image sensor and the cover, and an adhesive configured to fixedly attach the spacer to the image sensor.

Figure 1:
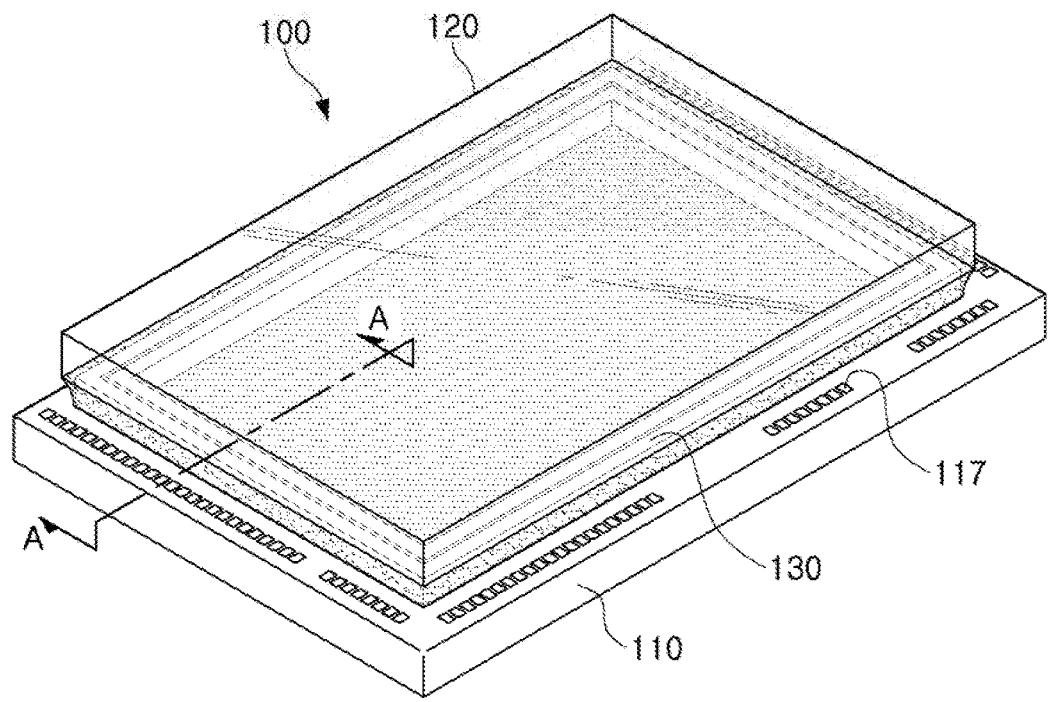
FIG. 1 is a diagram illustrating an example of an image sensor assembly.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. As used herein, the term "and/or" includes any and all combinations of one or more of the associated listed items. It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise.

Figure 2:
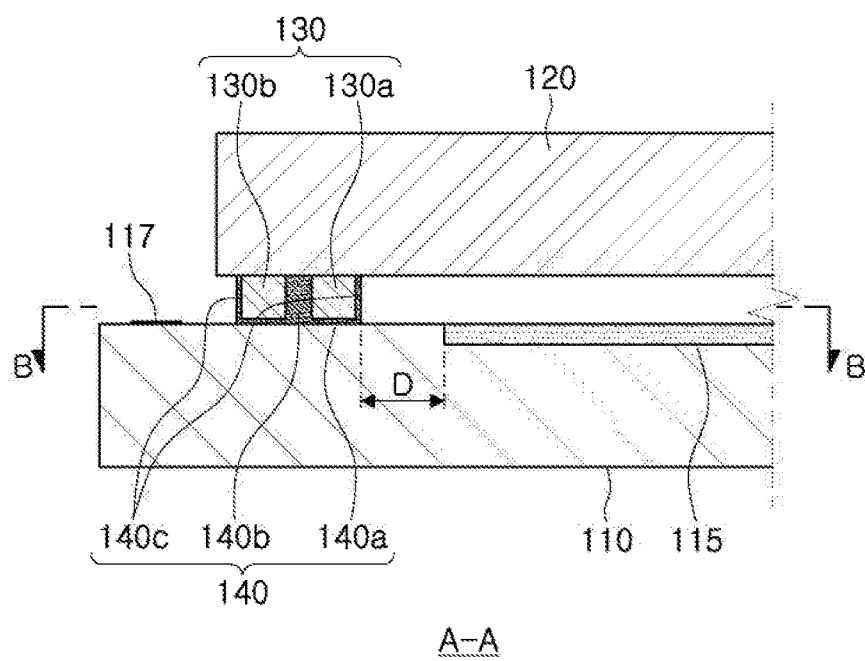
FIG. 2 is a diagram illustrating an example of a view taken along line A-A of FIG. 1.
Figure 3:
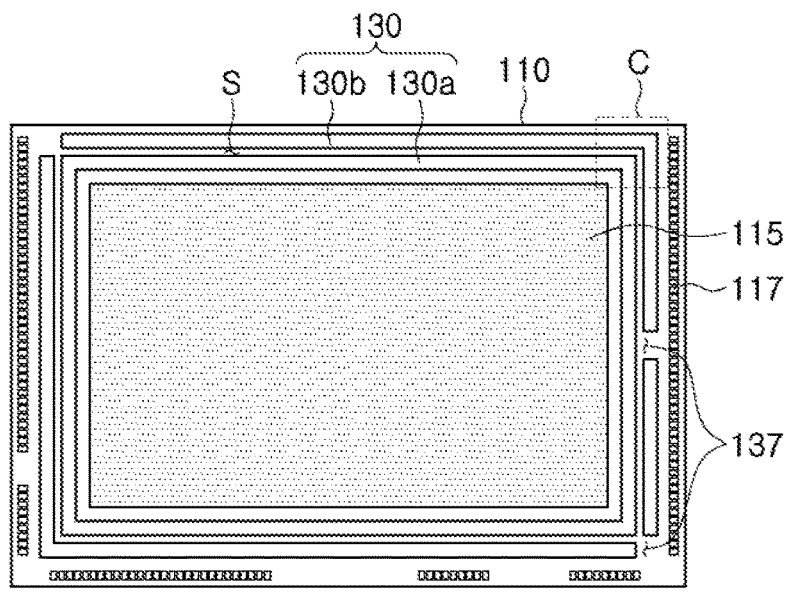
FIG. 3 is a diagram illustrating an example of a view in a cross section taken along line B-B of FIG. 2.

FIG. 1 is a diagram illustrating an example of an image sensor assembly. FIG. 2 is a diagram illustrating an example of cross-sectional taken along line A-A of FIG. 1. FIG. 3 is a diagram illustrating an example of a cross section taken along line B-B of FIG. 2.

Referring to FIGS. 1 through 3, an image sensor assembly 100 includes an image sensor 110 and a cover 120.

In an example, the image sensor 110 is formed of a rectangular chip. For example, a bare chip obtained by cutting a semiconductor wafer may be used as the image sensor 110.

An effective pixel region 115 converts a photo-image of a subject formed by a lens part 30 (see FIG. 7), which is an optical system, into an electrical signal. Electrodes 117 externally transmits the signal obtained from the effective pixel region 115, and the electrodes 117 may be formed on an upper surface of the image sensor 110.

As illustrated in FIG. 3, in an example, the electrodes 117 are disposed at an outer side of the effective pixel region 115 along a circumference of the effective pixel region 115.

In an example, the cover 120 is disposed above the effective pixel region 115 of the image sensor 110. The cover 120 may filter a specific component of incident light introduced into the image sensor 110. The cover 120 is disposed apart from the effective pixel region 115, but is disposed at a position as close to the effective pixel region 115 as possible.

In an example, the cover 120 is directly adhered to the upper surface of the image sensor 110 through a spacing part (or a spacer) 130. Therefore, a distance between the cover 120 and the image sensor 110 may be defined by a height of the spacing part 130.

In an example, the cover 120 is formed of a transparent material that introduces light for forming an image into the image sensor 110. A glass cover 120 or an infrared cut-off filter (IRCF) preventing infrared light from passing into the image sensor 110 may be used as the cover 120. For example, a blue glass (or a blue filter) for an infrared cut-off filter or a film filter is used as the cover 120.

However, a material of the cover 120 is not limited thereto. Various materials may be used as a material of the cover 120 without departing from the spirit and scope of the illustrative examples described as long as they allow light for forming an image to be incident to the effective pixel region 115 of the image sensor 110 and seal the effective pixel region 115.

The cover 120 may have an area smaller than that of an image sensor 100 to be described below. In an example, an area of the cover 120 is larger than that of the effective pixel region 115 of the image sensor 100 and is smaller than that of a region formed by the electrodes 117.

Since the cover 120 is smaller than the region formed by the electrodes 117, the cover 120 may be bonded onto the image sensor 110 so that the electrodes 117 are completely exposed outwardly.

Therefore, binding wires 50 (see FIG. 7) may be bonded onto the electrodes 117 even when the cover 120 is bonded onto the image sensor 100. As a result, the electrodes 117 may be electrically externally connected after the image sensor assembly 100 is manufactured.

In an example, the spacing part 130 is formed on a lower surface of the cover 120.

The spacing part 130 may be formed in a ring shape along a circumference of the effective pixel region 115. Since the effective pixel region 115 is formed in a quadrangular shape, the spacing part 130 is also formed in a quadrangular ring shape. When the effective pixel region 115 is formed in other shapes, the spacing part 130 may also be formed in a shape corresponding to the shape of the effective pixel region 115.

The spacing part 130 is fixed to the image sensor 110 between the effective pixel region 115 and the electrodes 117 of the image sensor 110, for example. Therefore, the image sensor assembly 100 may be divided into an internal space and external space by the cover 120 and the spacing part 130. The effective pixel region 115 is disposed in the internal space and the electrodes 117 are disposed in the external space.

As shown in FIG. 2, the spacing part 130 is spaced apart from the effective pixel region 115 by a predetermined distance D, such as, for example, 50 μm. In an example, the spacing part 130 is also spaced apart from the electrodes 117 by a predetermined distance. The spacing of the spacing part 130 prevents an adhesion surface of an adhesion part 140 from extending to the effective pixel region 115 or to the electrodes 117. Therefore, the above-mentioned spacing may be reduced as long as the extension of the adhesion surface is reduced.

The spacing part 130 is formed beneath the cover 120 using a dry film photo-resist (DFR), for example. However, the spacing part 130 is not limited to being formed as described above, and the spacing part 130 may be formed using other methods without departing from the spirit and scope of the illustrative examples described.

An upper surface of the spacing part 130 adheres to the lower surface of the cover 120, and a lower surface of the spacing part 130 adheres to the upper surface of the image sensor 110. The spacing part 130 and the image sensor 110 may adhere to each other through the adhesion part 140, for example.

The spacing part 130 includes a plurality of spacers 130*a* and 130*b*, for example. The spacing part 130 includes an inner spacer 130*a* disposed adjacently to the effective pixel region 115 and an outer spacer 130*b* disposed adjacently to the electrodes 117. However, the spacing part 130 is not limited thereto, and may include one or more spacers disposed between the inner spacer 130*a* and the outer spacer 130*b*.

An outer contour of the outer spacer 130*b* may have a size smaller than that of an outer contour of the cover 120. For example, the outer contour of the outer spacer 130*b* may be disposed to be spaced apart from the outer contour of the cover 120 by a predetermined distance, such as, for example, 25 μm. Other arrangements of the outer contour of the outer spacer 130*b* are considered to be well within the scope of the present disclosure. For example, the outer contour of the outer spacer 130*b* may be disposed to be collinear with the outer contour of the cover 120.

As shown in FIG. 3, at least one vent hole 137 is formed in the outer spacer 130*b*.

The vent hole 137 may be formed as a path connecting a space S formed between the outer spacer 130*b* and the inner spacer 130*a* and an external space of the outer spacer 130*b* to each other. Therefore, gas positioned in the space between the spacers 130*a* and 130*b* may be discharged through the vent hole 137.

This configuration has been derived in order to prevent gas or air positioned in the space S between the spacers 130*a* and 130*b* from being expanded when heat is applied to an adhesive 5 (see FIG. 5) to harden the adhesive 5 when manufacturing the image sensor assembly 100.

The vent hole 137 may be formed in a corner portion or a side portion of the outer spacer 130*b* having a quadrangular shape. In addition, shapes, numbers, and positions of vent holes 137 are not limited as long as the vent holes 137 may externally discharge the gas positioned in the space S between the spacers 130*a* and 130*b*.

An internal space of the inner spacer 130*a* may be formed as a cavity.

In an example, the inner spacer 130*a* is formed in a continuous ring shape, without a vent hole. Therefore, the internal space of the inner spacer 130*a* is formed as a closed space. Since the effective pixel region 115 is protected from the surrounding environment, even if the image sensor assembly 100 is cleaned using water during manufacturing the image sensor assembly 100, the water may not permeate into the effective pixel region 115. Therefore, a cleaning process may be easily performed.

However, the vent hole 137 is not limited thereto, and may be formed in the inner spacer 130*a*, and may be formed in the outer spacer 130*b*. In this case, gas positioned in the internal space of the spacing part 130 may be externally discharged through the vent hole 137.

The adhesion part 140 may be interposed between the spacing part 130 and the image sensor 110 to adhere the spacing part 130 and the image sensor 110 to each other.

The adhesion part 140 may be an adhesive, such as, for example, thermosetting adhesive or a photosensitive adhesive.

As illustrated in FIG. 2, the adhesion part 140 is provided in the space between the spacers 130*a* and 130*b*, as well as, on lower surfaces of the spacers 130*a* and 130*b*. In an example, the adhesion part 140 includes a first adhesion part 140*a* disposed on the lower surfaces of the spacers 130*a* and 130*b* and a second adhesion part 140*b* disposed between the spacers 130*a* and 130*b*. The adhesion part 140 may include third adhesion parts 140*c* disposed on outer side surfaces of the spacers 130*a* and 130*b*.

The first adhesion part 140*a* is formed on a lower surface of the spacing part 130. In an example, the first adhesion part 140*a* is interposed in a thin film form between the lower surface of the spacing part 130 and the upper surface of the image sensor 110 to adhere the spacing part 130 and the image sensor 110 to each other.

The second adhesion part 140*b*, which is provided between the spacers 130*a* and 130*b*, may adhere to side surfaces (hereinafter referred to as inner side surfaces) of the spacers 130*a* and 130*b* facing each other, and may also adhere to the cover 120 and the image sensor 110.

The third adhesion parts 140*c* is formed on the outer side surfaces (side surfaces opposite to the inner side surfaces) of the spacers 130*a* and 130*b*. The third adhesion parts 140*c* is formed over a partial portion of the outer side surfaces or is formed over the entire outer side surfaces of the spacers 130*a* and 130*b* depending on an amount of adhesive 5 (see FIG. 5).

When the third adhesion parts 140*c* are formed over the entire outer side surfaces of the spacers 130*a* and 130*b*, the third adhesion parts 140*c* may be bonded to the cover 120 and the image sensor 110, similar to the second adhesion part 140*b*. In this case, the adhesion part 140 covers the entire exposed surfaces of the spacers 130*a* and 130*b*, and extends along surfaces of the spacers 130a and 130b to contact the lower surface of the cover 120 as well as the spacers 130a and 130b.

In the image sensor assembly 100, the spacing part 130 allowing the cover 120 and the image sensor 110 to be spaced apart from each other may be formed through the two spacers 130a and 130b disposed in parallel with each other. In addition, adhesive 5 may be provided between the two spacers 130a and 130b as well as on the lower surfaces of the spacers 130a and 130b.

Therefore, an adhesion area may be significantly increased, and thus adhesion may be increased.

Further, since the surrounding space of the effective pixel region 115 is closed by the cover 120, the spacing part 130, and the adhesion part 140, a water cleaning process for removing foreign material may be used after the cover 120 is attached, thereby increasing a production yield.

In an example, a case in which the vent hole 137 is formed in the outer spacer 130b has been described, the outer spacer 130b is not limited thereto. For example, the outer spacer 130b may also be formed in a continuous ring shape in which the vent hole is not formed, similar to the inner spacer 130a.

Figure 4:
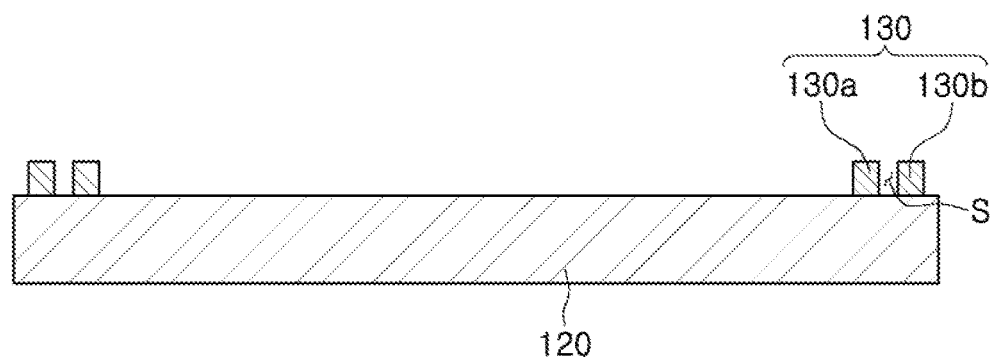
FIGS. 4 and 5 are diagrams illustrating examples of a method of manufacturing an image sensor assembly.
Figure 5:
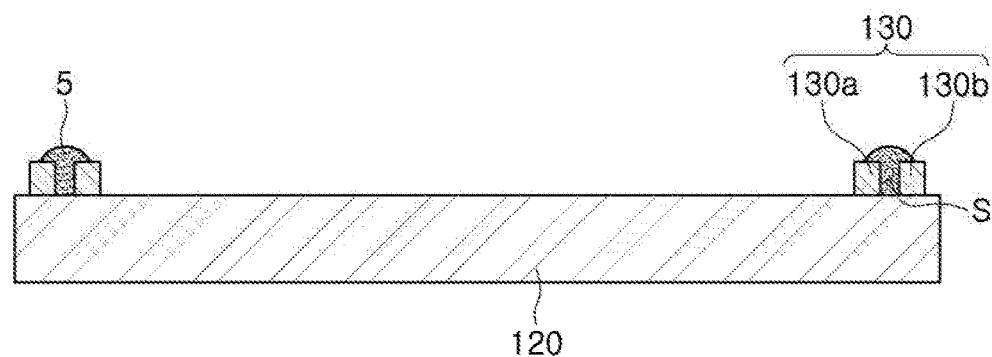

FIGS. 4 and 5 are diagrams illustrating examples of a method of manufacturing an image sensor.

As illustrated in FIG. 4, the cover 120 may be prepared, and the spacing part 130 may be formed on the cover 120. The spacing part 130 may be formed by a method such as, for example, a printing method, a dispensing method, or a photolithography method. For example, the spacing part 130 may be formed by forming a dry film photo-resist (DFR) on one surface of the cover 120 and partially removing the DFR through photolithography. However, Other process of forming the spacing part 130 are considered to be well within the scope of the present disclosure.

Widths or thicknesses of the spacers 130a and 130b configuring the spacing part 130 or an interval between the spacers 130a and 130b may be defined depending on a size of the cover 120. In an example, the interval between the spacers 130a and 130b may correspond to or be smaller than a thickness of the inner spacer 130a (or the outer spacer).

In an example, the inner spacer 130a and the outer spacer 130b may have the same thickness and the same width. However, the inner spacer 130a and the outer spacer 130b are not limited thereto, and various modifications are considered to be well within the scope of the present disclosure. For example, the inner spacer 130a and the outer spacer 130b may have different widths.

As illustrated in FIG. 5, the adhesive 5 may be applied to the spacing part 130.

The adhesive 5 may be applied in a dispensing scheme or an injection scheme. In more detail, a liquid-state adhesive 5 may be applied to the spacing part 130 while being injected in the space between the inner spacer 130a and the outer spacer 130b using an injection member (not illustrated) such as, for example, an injector.

Therefore, the adhesive 5 may be provided in the space S between the inner spacer 130a and the outer spacer 130b. In addition, the adhesive 5 may also be applied onto the lower surfaces of the spacers 130a and 130b. The adhesive 5 may be partially applied onto the lower surfaces of the spacers 130a and 130b, or may be applied over the entire lower surfaces of the spacers 130a and 130b.

The adhesive 5 may be injected into any one point or several points in the space between the inner spacer 130a and the outer spacer 130b.

Figure 6A:
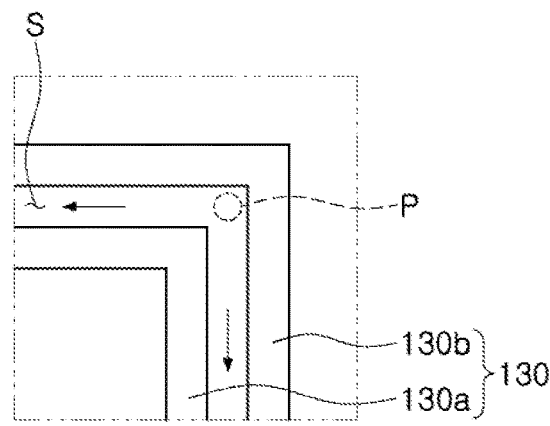
FIG. 6A is a diagram illustrating an example of an enlarged cross-sectional of part C of FIG. 3.

FIG. 6A is a diagram illustrating a cross-sectional view of part C of FIG. 3. Referring to FIGS. 5 and 6A, in an example, the adhesive 5 is injected from an injection point P, i.e., a corner portion in which an interval between the inner spacer 130a and the outer spacer 130b is largest. The adhesive 5 injected into the injection point P may be applied to the spacers 130a and 130b while being diffused in the space S between the inner spacer 130a and the outer spacer 130b by a capillary phenomenon.

However, the adhesive 5 is not limited to being injected as described above, and other methods of injection are considered to be well within the scope of the present disclosure. For example, the adhesive 5 may be injected while moving the injection member along the space S between the inner spacer 130a and the outer spacer 130b.

A case where the adhesive 5 is applied in the dispensing scheme or the injection scheme has been described, the adhesive 5 is not limited to being applied in the scheme described above. For example, the adhesive 5 may be applied in a dipping scheme, i.e., the spacers may be dipped in a container in which the adhesive 5 is contained to apply the adhesive 5 to the spacers.

The cover 120 and the spacing part 130 to which the adhesive 5 is applied may be attached to the image sensor 110. The spacing part 130 to which the adhesive 5 is applied may be seated on the image sensor 110, and the adhesive 5 may be hardened.

Various methods may be used to harden the adhesive 5, depending on the kind of adhesive 5. For example, when the adhesive 5 is a thermosetting solution, heat may be applied to the adhesive 5 to harden the adhesive 5, when the adhesive 5 is an ultraviolet (UV) curable solution, UV light may be irradiated to the adhesive 5 to harden the adhesive 5.

The image sensor assembly 100, illustrated in FIG. 1, may be completed when the adhesive 5 is hardened.

When the adhesive 5 is injected between the spacers, the adhesive 5 does not need to be applied onto a surface of the image sensor. Therefore, a flow of the adhesive 5 along the surface of the image sensor may be reduced. In addition, an alignment tolerance may not be present between the applied adhesive 5 and the spacers, and an adhesion area of the adhesion part may have a size similar to that of the lower surfaces of the spacers.

Therefore, a distance between the spacing part and the effective pixel region may be significantly reduced.

In the method of manufacturing an image sensor assembly described above, the adhesion part may be formed using the adhesive 5, thereby obtaining strong adhesion regardless of ruggedness of the surface of the image sensor.

In addition, since the adhesive 5 is applied to the spacing part in the dispensing scheme, the adhesion solution may be applied rapidly, thereby increasing productivity.

Figure 6B:
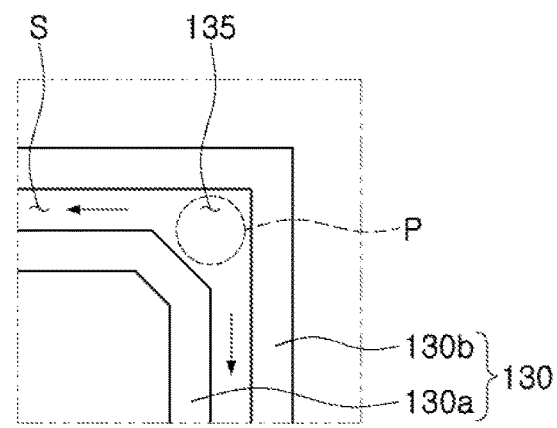
FIGS. 6B and 6C are diagrams illustrating examples of an image sensor assembly.
Figure 6C:
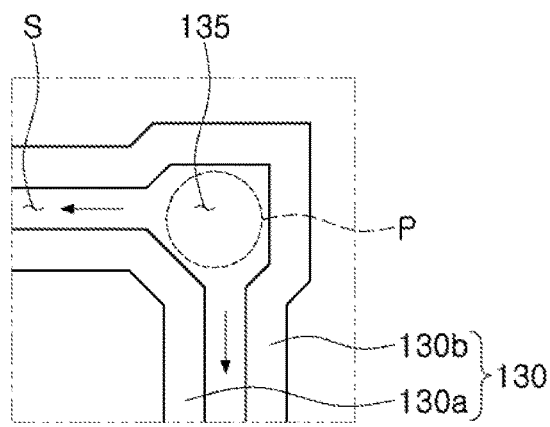

FIGS. 6B and 6C are enlarged views of cross-section corresponding to part C of FIG. 3 and illustrate another example of image sensor assembly.

Referring to FIGS. 6B and 6C, an extension groove 135 is formed in each corner portion of a quadrangular shape in a spacing part 130. The extension groove 135 extends an interval between the inner spacer 130a and the outer spacer 130b.

The extension grooves 135 may be formed in all the corner portions, however, other arrangements of the extension grooves 135 are considered to be well within the scope of the present disclosure. For example, the extension grooves 135 may be selectively formed in one or several of the respective corner portions. Although a case in which the extension grooves 135 are formed in only the corner portions has been described, other forms of the extension grooves 135 are considered to be well within the scope of the present disclosure. For example, at least one extension groove 135 may also be formed in a linear side portion in addition to the corner portions.

In an example, the extension groove 135 is used as the injection point P into which the adhesive 5 is injected in a process of applying the adhesive 5. When the extension groove 135 is not present, the interval between the spacers 130a and 130b may be narrow, and thus the adhesive 5 may leak out of the spacers 130a and 130b when injecting the adhesive.

When the extension groove 135 is formed, the adhesive 5 may be injected using a relative wide space. Therefore, the leakage of the adhesive 5 may be reduced, and thus the image sensor assembly may be easily manufactured.

As illustrated in FIG. 6B, in an example, the extension groove 135 may be formed by changing a shape of the inner spacer 130a. In another example, as illustrated in FIG. 6C, the extension groove 135 may be formed by changing both shapes of the inner spacer 130a and the outer spacer 130b.

However, the extension groove 135 is not limited to being formed as described above, and may be variously modified without departing from the spirit and scope of the illustrative examples described. For example, the extension groove 135 may be formed by changing only a shape of the outer spacer 130b.

Figure 7:
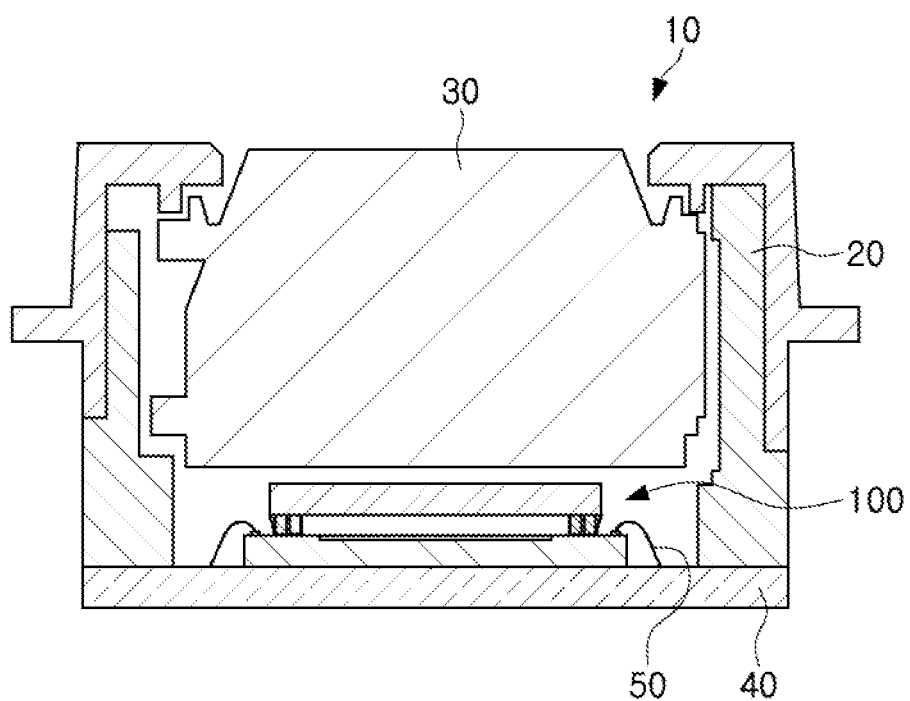
FIG. 7 is diagram illustrating an example of a camera module.

FIG. 7 is a cross-sectional view illustrating an example of a camera module.

Referring to FIG. 7, a camera module 10 includes the image sensor assembly 100 described above, a substrate 40, a housing 20, and the lens part 30 coupled to the housing 20.

The substrate 40 has a wiring formed thereon, and the image sensor 110 may be seated on an upper surface of the substrate 40.

External connection terminals (not illustrated) such as, for example, a conductive pad, a pin, and the like, connected to the image sensor 110 may be formed on the substrate 40. In the example of FIG. 7, the substrate 40 and the image sensor 110 are electrically connected by a bonding wire 50. However, a method of connecting the substrate 40 and the image sensor 110 to each other is not limited thereto, and may be variously modified. For example, the substrate 40 and the image sensor 110 may be connected to each other in a flip-chip bonding scheme.

Various types of substrates such as, for example, a printed circuit board (PCB), a flexible substrate, a ceramic substrate, or a glass substrate may be used as the substrate 40 as long as wirings are formed thereon.

The lens part 30 may include one or more lenses, and may be coupled to the housing 30. Here, the lens part 30 is coupled to the housing 20 such that the lens or the entire lens part 30 is movable in order to focus an optical system.

The housing 20 includes an internal space to accommodate the lens part 30, and to support the lens part 30. In an example, the substrate 40 is coupled to a lower end of the housing 20. In an example, the substrate 40 is coupled to the housing 20 so that the image sensor assembly 100 is accommodated in the housing 20.

A cover of the camera module configured as described above is not attached to the housing, and may be attached to the image sensor. Therefore, a thickness (or a height) of the camera module may be reduced as compared to the camera module according to the related art coupled to the housing, and thus the camera module may be easily mounted in a thin portable terminal.

As set forth above, in the image sensor assembly an adhesive may be provided in the space between the two spacers as well as on the lower surfaces of the spacers. Therefore, an adhesion area may be significantly increased, and thus adhesion may be increased.

In addition, in the method of manufacturing an image sensor assembly, since the adhesive 5 is applied between the spacers in the dispensing scheme, the adhesive 5 may be applied rapidly, thereby increasing productivity.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An image sensor assembly, comprising:
   an image sensor comprising a pixel region provided on a surface of the image sensor;
   a cover disposed above the pixel region;
   a spacer disposed on a surface of the cover, configured to maintain a distance between the image sensor and the cover, and comprising a first member and a second member disposed parallel to each other; and
   an adhesive configured to fixedly attach the spacer to the image sensor and comprising:
   a first adhesion part interposed between the spacer and the image sensor,
   a second adhesion part filled in a space between the first member and the second member, and
   a third adhesion part disposed on an outer side surface of either one of the first member and the second member,
   wherein the second adhesion part and the third adhesion part are each bonded to the cover and the image sensor.

2. The camera module of claim 1, wherein the substrate is connected to the image sensor assembly with a bonding wire.

3. The image sensor assembly of claim 1, wherein the first member is configured to enclose the effective pixel region and the second member encloses the first member.

4. The image sensor assembly of claim 3, wherein the spacer comprises an extension groove, the extension groove extending the distance between the first member and the second member within the extension groove.

5. The image sensor assembly of claim 4, wherein the spacer has a quadrilateral shape, and the extension groove is provided in a vertex of the quadrilateral spacer.

6. The image sensor assembly of claim 1, wherein the image sensor comprises electrodes disposed along a circumference of the pixel region, and
   the spacer is disposed between the pixel region and the electrodes.

7. The image sensor assembly of claim 3, wherein the first member encloses an internal space containing the pixel region.

8. The image sensor assembly of claim 3, wherein the second member comprises a vent hole to discharge fluid between the first member and the second member.

9. The image sensor assembly of claim 6, wherein an area of the cover is greater than an area of the pixel region and smaller than an area of a region formed by the electrodes.

10. The image sensor assembly of claim 6, wherein the spacer is disposed at a first distance from the pixel region and at a second distance from the electrode.

11. The image sensor assembly of claim 1, wherein a shape of the spacer corresponds to a shape of the pixel region.

12. The image sensor assembly of claim 3, wherein the adhesive is injected into the extension groove and is diffused between the spacers.

13. A camera module comprising:
   a substrate on which an image sensor assembly is mounted;
   a lens part comprising at least one lens; and
   a housing configured to accommodate the lens part and the image sensor assembly, wherein the image sensor assembly comprises:
      an image sensor comprising a pixel region provided on a surface of the image sensor;
      a cover disposed above the pixel region;
      a spacer disposed on a surface of the cover, configured to maintain a distance between the image sensor and the cover, and comprising a first member and a second member disposed parallel to each other, wherein the second member comprises a vent hole to discharge fluid between the first member and the second member; and
      an adhesive disposed between the first member and the second member, and configured to fixedly attach the spacer to the image sensor.

* * * * *